(12) United States Patent
Takeuchi

(10) Patent No.: US 8,729,535 B2
(45) Date of Patent: May 20, 2014

(54) ORGANIC EL DISPLAY PANEL AND METHOD FOR PRODUCING SAME

(75) Inventor: Takayuki Takeuchi, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/429,696

(22) Filed: Mar. 26, 2012

(65) Prior Publication Data

US 2012/0175603 A1    Jul. 12, 2012

Related U.S. Application Data

(63) Continuation of application No. PCT/JP2010/003123, filed on May 7, 2010.

(51) Int. Cl.
  *H01L 29/08*  (2006.01)
  *H01L 35/24*  (2006.01)
  *H01L 51/00*  (2006.01)
  *H01L 21/00*  (2006.01)
  *H01L 51/40*  (2006.01)

(52) U.S. Cl.
  USPC .......... 257/40; 257/88; 257/89; 257/E27.119; 257/E51.018; 438/23; 438/82; 438/30; 438/99

(58) Field of Classification Search
  USPC ................ 257/40, 88, 89, E27.119, E51.018; 438/23, 82, 90, 99
  See application file for complete search history.

(56) References Cited

U.S. PATENT DOCUMENTS

| | | | |
|---|---|---|---|
| 5,443,922 A | 8/1995 | Nishizaki et al. | |
| 6,933,529 B2 | 8/2005 | Yoo et al. | |
| 7,214,960 B2 * | 5/2007 | Sano | 257/40 |
| 8,063,550 B2 | 11/2011 | Kim et al. | |
| 2004/0142502 A1 | 7/2004 | Yoo et al. | |
| 2005/0116240 A1 | 6/2005 | Kim et al. | |
| 2005/0282308 A1 | 12/2005 | Uhlig et al. | |

(Continued)

FOREIGN PATENT DOCUMENTS

| | | |
|---|---|---|
| JP | 5-163488 | 6/1993 |
| JP | 2004-096100 | 3/2004 |

(Continued)

OTHER PUBLICATIONS

U.S. Appl. No. 13/361,280 to Takashi Isobe et al., filed Jan. 30, 2012.

(Continued)

*Primary Examiner* — George Fourson, III
*Assistant Examiner* — Wilner Jean Baptiste
(74) *Attorney, Agent, or Firm* — Greenblum & Bernstein, P.L.C.

(57) ABSTRACT

Provided is an organic EL display panel that improves aperture ratio by providing a contact hole beneath an aperture in a bank, and that prevents shortening of the display panel's lifetime by avoiding electric field concentration. An organic EL display panel includes a TFT layer; an interlayer insulation film on the TFT layer and having a plurality of contact holes one per pixel; a plurality of first electrodes, one per pixel, on the interlayer insulation film; a bank defining a plurality of apertures, at least one per pixel, and at least one contact hole is located beneath each aperture; a plurality of organic light-emitting layers each in an aperture; and a second electrode above the organic light-emitting layers. In each aperture, a thickness of the organic light-emitting layer is greater at a portion within the contact hole region than at a portion outside the contact hole region.

16 Claims, 12 Drawing Sheets

(56) References Cited

U.S. PATENT DOCUMENTS

| | | | |
|---|---|---|---|
| 2010/0200869 A1* | 8/2010 | Sekiya | 257/88 |
| 2011/0108859 A1 | 5/2011 | Oosako | |
| 2011/0272677 A1 | 11/2011 | Takeuchi | |
| 2011/0278583 A1 | 11/2011 | Hayashi et al. | |

FOREIGN PATENT DOCUMENTS

| | | |
|---|---|---|
| JP | 2004-152595 | 5/2004 |
| JP | 2005-158672 | 6/2005 |
| JP | 2006-114480 | 4/2006 |
| JP | 2007-061674 | 3/2007 |
| JP | 2008-112875 | 5/2008 |
| JP | 2009-093904 | 4/2009 |
| JP | 2009-247918 | 10/2009 |

OTHER PUBLICATIONS

International Search Report in PCT/JP2010/003123, dated Jun. 6, 2010.
Preliminary Examination Report in PCT/JP2010/003123, dated Sep. 2, 2011.

* cited by examiner

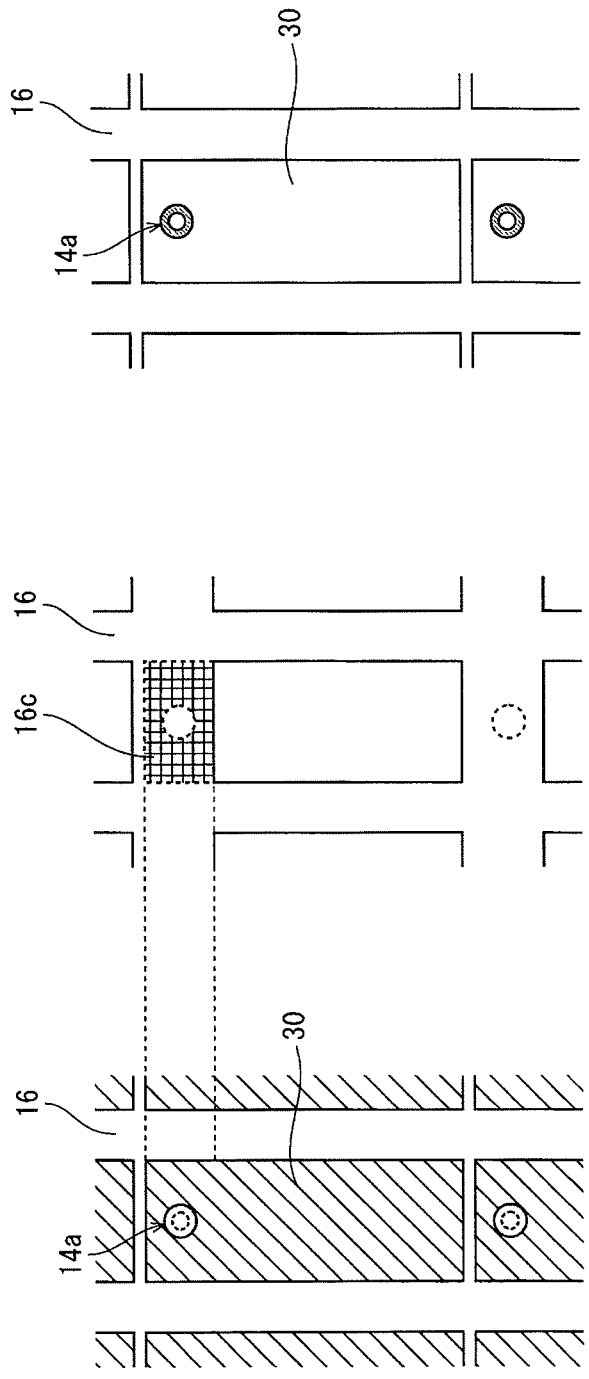

ORGANIC EL DISPLAY PANEL AND METHOD FOR PRODUCING SAME

CROSS REFERENCE TO RELATED APPLICATION

This is a continuation application of PCT Application No. PCT/JP2010/003123 filed May 7, 2010, designating the United States of America, the disclosure of which, including the specification, drawings and claims, is incorporated herein by reference in its entirety.

TECHNICAL FIELD

The present invention relates to an organic EL display panel and in particular to technology for improving aperture ratio.

BACKGROUND ART

In recent years, research and development has progressed in the area of organic electroluminescence (hereinafter "organic EL") display panels that use the phenomenon of electroluminescence of organic material. Each organic EL cell of an organic EL display panel has an anode, a cathode, and an organic light-emitting layer provided between the anode and the cathode. The anode is layered on an interlayer insulation film that is layered on a Thin Film Transistor (TFT) substrate for driving the cells. To connect the anode with an electrode of the TFT, a through-hole (contact hole) is provided in the direction of thickness of the interlayer insulation film. The contact holes are buried under the bank so as not to emit light. However, such a structure hinders improvement of aperture ratio, which prevents an increase in the light-emitting surface area in an organic EL display panel and prevents improvement of luminous efficiency (see Patent Literature 1).

CITATION LIST

Patent Literature

[Patent Literature 1]
Japanese Patent Application Publication No. 2007-61674

SUMMARY OF INVENTION

Technical Problem

In an attempt to improve aperture ratio, each contact hole that is buried, according to a conventional arraignment, under the bank may simply be provided within an aperture surrounded by the bank. However, in such a structure, the organic light-emitting layer becomes concave in conformity with the recess of the contact hole. In this case, although light-emitting material used to form the organic light-emitting layer is viscous, the light-emitting material flows towards the bottom surface of the contact hole due to gravity. As a result, the organic light-emitting layer becomes thinner along the slanted surface that extends from the upper periphery of the contact hole to the bottom surface of the contact hole, in particular around the upper periphery of the contact hole. In the region where the film is thinner, the distance between the anode and the cathode is shorter than in other regions. This results in irregular light emission due to concentration of the electric field, which causes the problem of shortening the lifetime of the organic EL display panel.

In light of the above problems, it is an object of the present invention to provide an organic EL display panel that improves luminous efficiency by providing contact holes within apertures defined by the bank to improve the aperture ratio, and that can also prevent shortening of the display panel's lifetime by not causing concentration of the electric field.

Solution to Problem

In order to solve the above problems, an organic EL display panel according to one aspect of the present invention includes: a TFT layer; an interlayer insulation film on the TFT layer and having a plurality of contact holes, each of the plurality of contact holes corresponding to one of pixels; a plurality of first electrodes on the interlayer insulation film, each of the plurality of first electrodes corresponding to one of the pixels and being conductive with the TFT layer via one of the plurality of contact holes; a bank defining a plurality of apertures, at least one of the plurality of apertures corresponding to each of a plurality of colors, and at least one of the plurality of contact holes located beneath each of the plurality of apertures; a plurality of organic light-emitting layers each in one of the plurality of apertures; and a second electrode above the organic light-emitting layers. Each of the plurality of contact holes and a region thereabove constitutes a contact hole region. In each of the plurality of apertures, a thickness of the organic light-emitting layer is greater at a portion within the contact hole region than at a portion outside the contact hole region.

Advantageous Effects of Invention

According to the above aspect of the present invention, in the organic EL display panel having the above structure, each aperture defined by the bank per pixel includes a contact hole. This structure allows the apertures to be larger and the aperture ratio to improve as compared with conventional structures. Consequently, the light-emitting surface area increases and thus the luminous efficiency improves. More specifically, in each aperture, the organic light-emitting layer is thicker at a portion located within the contact hole region than at a portion located outside the contact hole region. This prevents concentration of the electric field along the slanted surface that extends from the upper periphery of the contact hole to the bottom surface of the contact hole, in particular around the upper periphery of the contact hole.

Furthermore, since the organic light-emitting layer formed in each aperture has a thicker portion in the contact hole region than the other portion located outside the contact hole region, the electric field in each contact hole region is smaller as compared to the region other than the contact hole region. Accordingly, while the organic light-emitting layer emits light in the region other than the contact hole region, the organic light-emitting layer either does not emit light in the contact hole region or emits light at a lower luminance than in the region other than the contact hole region. However, the contact hole region occupies only a very small area within the aperture, and therefore even if the contact hole region does not emit light, or emits light at a low luminance, there is little overall effect on the aperture as a whole. That is, the presence of the contact hole regions does not cause reduction of the overall luminescence brightness. Therefore, by locating the contact holes beneath the apertures defined one for each pixel by the bank, the aperture ratio increases and thus the luminescence brightness improves.

BRIEF DESCRIPTION OF DRAWINGS

FIGS. 5A, 5B, and 5C are schematic views each showing distribution of luminescence brightness in apertures according to the embodiment of the present invention.

DESCRIPTION OF EMBODIMENTS

<Aspects of the Invention>

Figure 1:
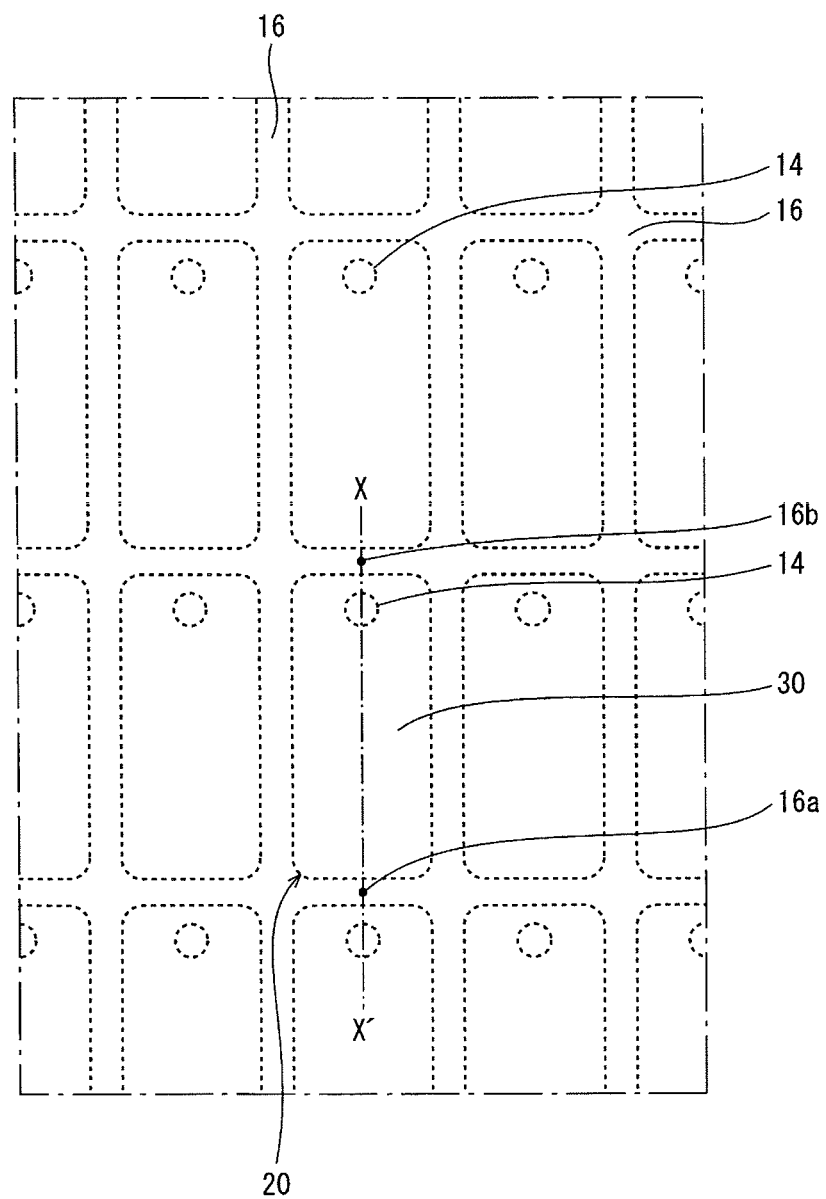
FIG. 1 is a schematic plan view showing part of an organic EL display panel according to one embodiment of the present invention.

According to one aspect of the present invention, an organic EL display panel includes: a TFT layer; an interlayer insulation film on the TFT layer and having a plurality of contact holes, each of the plurality of contact holes corresponding to one of pixels; a plurality of first electrodes on the interlayer insulation film, each of the plurality of first electrodes corresponding to one of the pixels and being conductive with the TFT layer via one of the plurality of contact holes; a bank defining a plurality of apertures, at least one of the plurality of apertures corresponding to each of a plurality of colors, and at least one of the plurality of contact holes located beneath each of the plurality of apertures; a plurality of organic light-emitting layers each in one of the plurality of apertures; and a second electrode above the organic light-emitting layers. Each of the plurality of contact holes and a region thereabove constitutes a contact hole region. In each of the plurality of apertures, a thickness of the organic light-emitting layer is greater at a portion within the contact hole region than at a portion outside the contact hole region.

Optionally, in the organic EL display panel, the portion of each light-emitting layer within the contact hole region may be composed of a plurality of layers of a same material of a same color layered on one another so that, in each of the plurality of apertures, a thickness of the multi-layered portion of the light-emitting layer is greater than the portion of the of the light-emitting layer outside the contact hole region.

According to this aspect, each aperture defined per pixel by the bank includes a contact hole, which allows the apertures to be larger thereby to improve the aperture ratio. This increases the light-emitting surface area and improves luminous efficiency. More specifically, in each aperture, the organic light-emitting layer is thicker at a portion located within the contact hole region than at a portion located outside the contact hole region. This prevents concentration of the electric field along the slanted surface that extends from the upper periphery of the contact hole to the bottom surface of the contact hole.

Furthermore, since the organic light-emitting layer formed in each aperture has a thicker portion in the contact hole region than the other portion located outside the contact hole region, the electric field in each contact hole region is smaller as compared to the region other than the contact hole region. Accordingly, while the organic light-emitting layer emits light in the region other than the contact hole region, the organic light-emitting layer either does not emit light in the contact hole region or emits light at a lower luminance than in the region other than the contact hole region. However, the contact hole region occupies only a very small area within the aperture, and therefore even if the contact hole region does not emit light, or emits light at a low luminance, there is little overall effect on the aperture as a whole. That is, the presence of the contact hole regions at such locations does not cause reduction of the overall luminescence brightness. Therefore, by locating the contact holes beneath the apertures defined one for each pixel by the bank, the aperture ratio increases and thus the luminescence brightness improves.

Optionally, in the organic EL display panel, the plurality of layers of the multi-layered portion of each of the light-emitting layers may include a first layer and a second layer both of which are of a same material of a same color, the second layer being layered on the first layer and within the contact hole region on the first layer after the first layer has been dried.

According to this aspect, the first layer of each organic light-emitting layer is formed by dripping and drying ink containing an organic light-emitting material, before the second layer of the organic light-emitting layer is formed. Therefore, the second layer is formed by dripping, on the solidified first layer, ink containing an organic light-emitting material of the same color as the first layer. As a result, the ink having been solidified is no longer mixable with the later applied ink containing the organic light-emitting material of the same color as the solidified ink. That is, a plurality of organic light-emitting layers of the same color may be formed one on another.

Optionally, in the organic EL display panel, the bank may define the plurality of apertures in lines, each of the plurality of apertures corresponding to one of the plurality of colors.

According to this aspect, each aperture defined per pixel by the bank of the line-bank configuration includes a contact hole, which allows the apertures to be larger and the aperture ratio to improve as compared with conventional structures. This increases the light-emitting surface area and improves luminous efficiency.

Optionally, in the organic EL display panel, the bank may define the plurality of apertures each of which corresponds to one of the pixels, to one of the plurality of colors, and to one of the plurality of first electrodes.

According to this aspect, each aperture defined per pixel by the bank of the pixel-bank configuration includes a contact hole, which allows the apertures to be larger and the aperture ratio to improve as compared with conventional structures. This increases the light-emitting surface area and improves luminous efficiency.

Optionally, in the organic EL display panel, the color of an individual one of the plurality of light-emitting layers may be one of red, green, and blue.

According to this aspect, the color of an individual one of the plurality of light-emitting layers may be any of red, green, and blue.

Optionally, in the organic EL display panel, the interlayer insulation film may be a planarizing film.

According to this aspect, the interlayer insulation film fills unevenness in the surface of the TFT layer to provide a flat surface.

According to another aspect of the present invention, an organic EL display device includes the organic EL display panel according to any one of the above aspects of the present invention.

According to this aspect, an organic EL display device provided with the above-described organic EL display panel is achieved.

According to yet another aspect of the present invention, a method for manufacturing an organic EL display panel includes: a first step of forming a TFT layer; a second step of forming an interlayer insulation film on the TFT layer; a third step of forming a plurality of contact holes in the interlayer insulation film, each of the plurality of contact holes corresponding to one of pixels; a fourth step of forming a plurality of first electrodes on the interlayer insulation film, each of the plurality of first electrodes corresponding to one of the pixels and being conductive with the TFT layer via one of the plurality of contact holes; a fifth step of forming a bank that defines a plurality of apertures, at least one of the plurality of contact holes located beneath each of the plurality of apertures; a sixth step of forming a plurality of organic light-emitting layers each in one of the plurality of apertures; and a seventh step of forming a second electrode above the organic light-emitting layers. Each of the plurality of contact holes and a region thereabove constitutes a contact hole region. In the sixth step, the plurality of organic light-emitting layers are formed so that, in each of the plurality of apertures, a thickness of the organic light-emitting layer is greater at a portion within the contact hole region than at a portion outside the contact hole region.

In the manufacturing method according to this aspect of the present invention, the bank is formed to define apertures one per pixel in a manner that each aperture thus formed includes a contact hole. Consequently, the aperture size is enlarged and the aperture ratio is thus increased. This increases the light-emitting surface area and improves luminous efficiency. More specifically, in each aperture, the organic light-emitting layer is thicker at a portion located within the contact hole region than at a portion located outside the contact hole region. This prevents concentration of the electric field along the slanted surface that extends from the upper periphery of the contact hole to the bottom surface of the contact hole.

Furthermore, since the organic light-emitting layer formed in each aperture has a thicker portion in the contact hole region than the other portion located outside the contact hole region, the electric field in each contact hole region is smaller as compared to the region other than the contact hole region. Accordingly, while the organic light-emitting layer emits light in the region other than the contact hole region, the organic light-emitting layer either does not emit light in the contact hole region or emits light at a lower luminance than in the region other than the contact hole region. However, the contact hole region occupies only a very small area within the aperture, and therefore even if the contact hole region does not emit light, or emits light at a low luminance, there is little overall effect on the aperture as a whole. That is, the presence of the contact hole region at such locations does not cause reduction of the overall brightness. Therefore, by locating the contact holes beneath the apertures defined one for each pixel by the bank, the aperture ratio increases and thus the luminescence brightness improves.

Furthermore, in the step of forming an organic light-emitting layer in each of the plurality of apertures, the organic light-emitting layer is formed so as to be thicker at a portion within the contact hole region than at a portion outside the contact hole region. That is, the thickness of the portion of each organic light-emitting layer is made thicker in the same step as forming the organic light-emitting layer, without requiring any additional process dedicated for the purpose. Consequently, while being simple, the manufacturing method according to this aspect prevents occurrence of concentration of the electric field at the contact holes and thus improves the luminescence brightness.

Optionally, in the sixth step of the manufacturing method, to form the greater thickness portion of each light-emitting layer within the contact hole region, a plurality of layers of a same material of a same color may be layered on one another so that, in each of the plurality of apertures, a thickness of the multi-layered portion of the light-emitting layer is greater than the portion of the of the light-emitting layer outside the contact hole region.

According to this aspect, only the portion of each organic light-emitting layer located within the contact hole region is made thicker than the other portion, i.e., the portion located outside the contact hole region.

Optionally, in the sixth step of the manufacturing method, a first layer and a second layer of the multi-layered portion may be formed of a same color, the second layer being layered on the first layer and within the contact hole region after the first layer has been dried.

According to this aspect, the first layer of each organic light-emitting layer is formed by dripping and drying ink containing an organic light-emitting material, before the second layer of the organic light-emitting layer is formed. Therefore, the second layer is formed by dripping, on the solidified first layer, ink containing an organic light-emitting material of the same color as the first layer. As a result, the ink having been solidified is no longer mixable with the later applied ink containing the organic light-emitting material of the same color as the solidified ink. That is, a plurality of organic light-emitting layers of the same color may be formed one on another.

That is, a plurality of organic light-emitting layers of the same color may be formed one on another.

Optionally, in the sixth step of the manufacturing method, an ink jet method may be used to form the organic light-emitting layers.

According to this aspect, an ink jet method is used to form the organic light-emitting layers in the sixth step. With the ink jet method, ink containing an organic EL light-emitting material can be dripped to a high degree of precision in predetermined locations of pixels, such as the contact hole. Therefore, the light-emitting layers can be formed without using additional elements or manufacturing processes, such as a mask.

Optionally, in the sixth step of the manufacturing method, an ink-jet method may be used to form the organic light-emitting layers, and ink containing an organic light-emitting material of a same color may be dripped into each of the plurality of contact hole regions to form the plurality of layers laminated on one another within the contact hole region.

Optionally, in the sixth step of the manufacturing method, an ink-jet method may be used to form the organic light-emitting layers, and ink containing an organic light-emitting material of a same color may be dripped into each of the plurality of contact hole regions to form the plurality of layers laminated on one another within the contact hole region.

According to this aspect, only the portion of each organic light-emitting layer located within the contact hole region is made thicker than the other portion, i.e., the portion located outside the contact hole region.

Optionally, in the sixth step of the manufacturing method, an ink-jet method may be used to form the organic light-emitting layers. In addition, in the sixth step of the manufacturing method, the following sub-steps may be sequentially performed: ink containing an organic light-emitting material of one of the colors is dripped into the contact hole region in each of the plurality of apertures to form the first layer; the ink dripped into the contact hole region in each of the plurality of apertures is dried so that the first layer may be formed; and after the ink dripped to form the first layer is dried, ink containing an organic light-emitting material of the same color as the first layer is dripped into the contact hole region in the aperture to form the second layer.

According to this aspect, the first layer of each organic light-emitting layer is formed by dripping and drying ink containing an organic light-emitting material, before the second layer of the organic light-emitting layer is formed. Therefore, in the sixth step, the second layer is formed by dripping, on the solidified first layer, ink containing an organic light-emitting material of the same color as the first layer. As a result, the ink having been solidified is no longer mixable with the later applied ink containing the organic light-emitting material of the same color as the solidified ink. That is, a plurality of organic light-emitting layers of the same color may be formed one on another.

That is, a plurality of organic light-emitting layers of the same color may be formed one on another.

Optionally, in the manufacturing method, the bank may be formed to define the plurality of apertures in lines that each correspond to one of the plurality of colors.

According to this aspect, the bank is formed to define a plurality of apertures in lines and each of the apertures corresponds to one of the plurality of colors.

Optionally, in the manufacturing method, the bank may be formed to define the plurality of apertures each of which corresponds to one of the pixels, to one of the plurality of colors, and to one of the plurality of first electrodes.

According to this aspect, the bank is formed to define the plurality of apertures each of which corresponds to one of the pixels, to one of the plurality of colors, and to one of the plurality of first electrodes.

Optionally, in the manufacturing method, the color of an individual one of the plurality of light-emitting layers may be one of red, green, and blue.

According to this aspect, the color of an individual one of the plurality of light-emitting layers may be any of red, green, and blue.

Embodiments

<Overall Configuration>

FIG. 1 is a schematic plan view showing an organic EL display panel 1 according to an embodiment of the present invention.

The organic EL display panel 1 includes a plurality of, top emission type organic EL cells 20 arranged in a matrix. Each organic EL cell 20 is provided with a light-emitting layer corresponding to one of R (red), G (green), and B (blue). Each organic EL cell 20 corresponds to one pixel. Each organic EL cell 20 has an aperture 30 defined by a bank 16 of a so-called pixel-bank configuration (i.e., grid-shaped bank).

Figure 2:
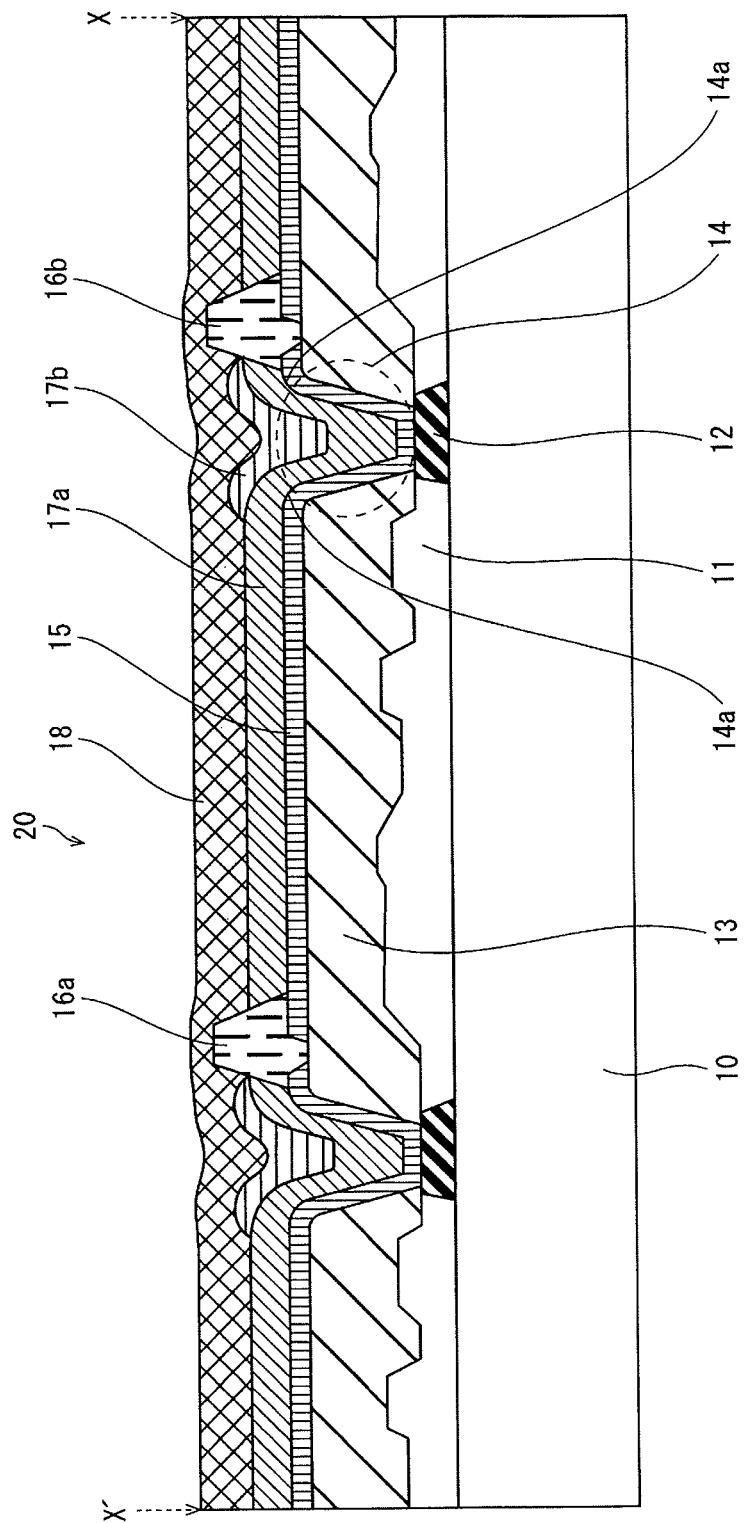
FIG. 2 is a schematic sectional view of the organic EL display panel according to the embodiment of the present invention, taken to show part around an organic EL cell.

FIG. 2 is a schematic sectional view showing the organic EL display panel 1, taken along the line X-X' of FIG. 1 to show part around an organic EL cell 20.

The substrate 10 is formed with an insulating material, such as alkalifree glass, soda glass, nonfluorescent glass, phosphate glass, borate glass, quartz, acrylic resin, styrenic resin, polycarbonate resin, epoxy resin, polyethylene, polyester, silicone resin, or alumina.

A Thin Film Transistor (TFT) layer 11 having power supply electrodes 12 is formed on the substrate 10, and an interlayer insulation film 13 is formed on the TFT layer 11.

The interlayer insulation film 13 is formed with an organic material having excellent insulating properties and is approximately 4 μm (micrometers) thick. Through-holes (contact holes 14) are formed in the direction of thickness of the interlayer insulation film 13. As the interlayer insulation film 13, it is preferable to form a planarizing film. With the interlayer insulation film 13, the uneven surface of the TFT layer is planarized.

<Contact Holes>

Figure 3A:
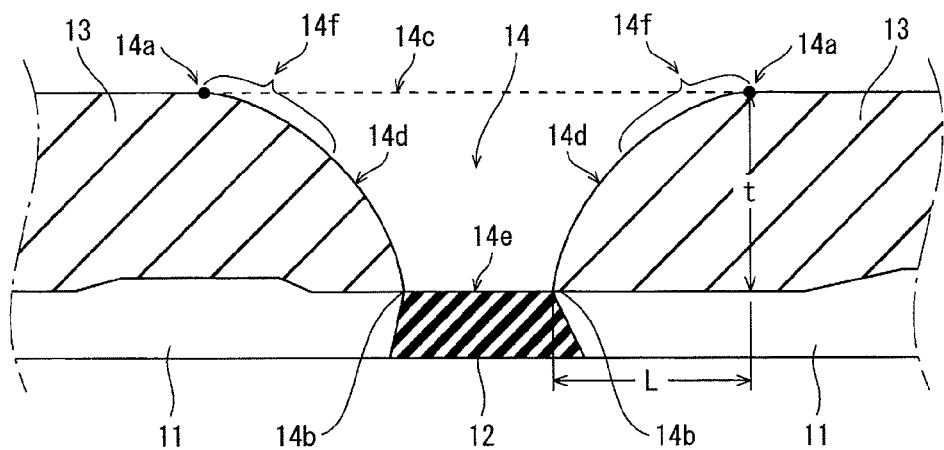
FIGS. 3A and 3B are views each showing a contact hole of an organic EL cell according to the embodiment of the present invention.
Figure 3B:
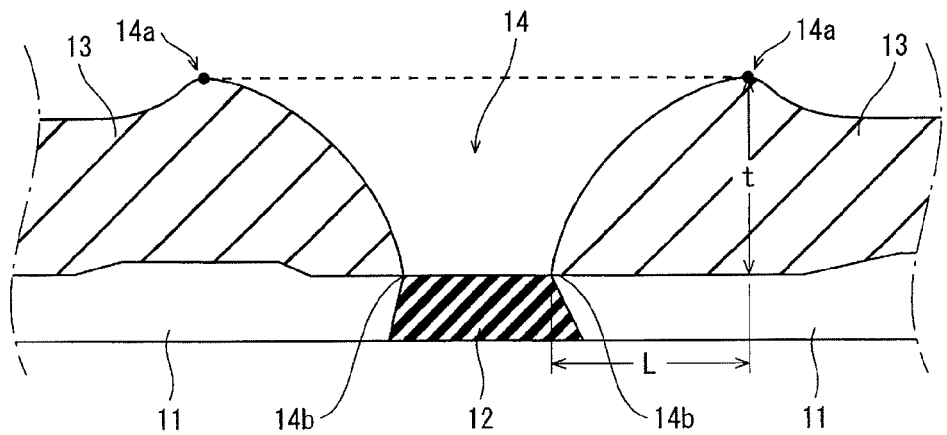
Figure 4:
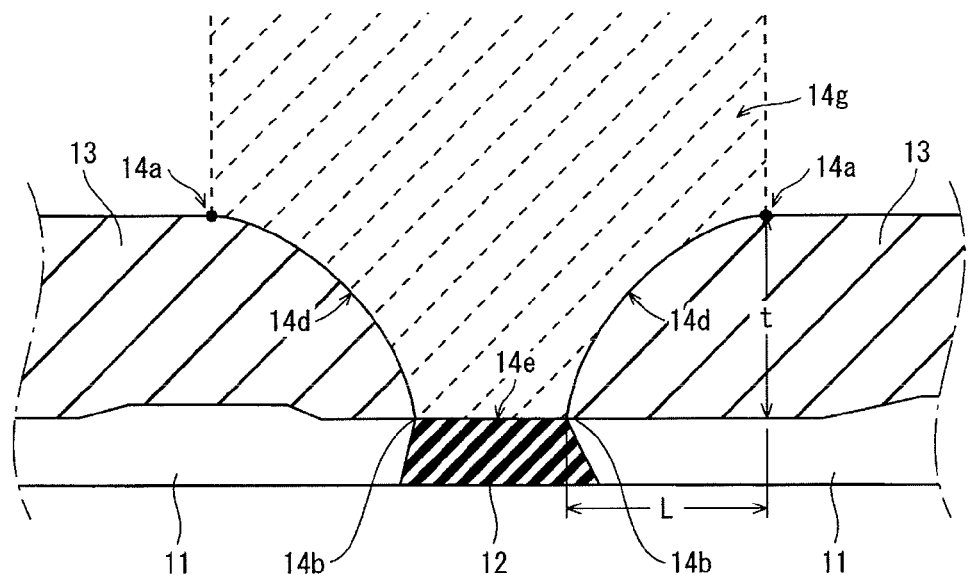
FIG. 4 is a view showing a contact hole of an organic EL cell according to the embodiment of the present invention.

The following is a detailed description of the contact holes 14 with reference to FIGS. 3 and 4.

FIGS. 3A and 3B are each an enlarged view of part around a contact hole 14 shown in FIG. 2. For the purpose of the explanation, FIG. 3 only show the TFT layer 11, the power supply electrodes 12, the interlayer insulation film 13, and the contact hole 14.

The contact hole 14 refers to a space surrounded by a contact hole upper surface 14c, contact hole slanted surface 14d, and contact hole bottom surface 14e shown in FIG. 3A. Note that the contact hole 14 as described above is a through-hole, and the contact hole upper surface 14c and contact hole bottom surface 14e are imaginary surfaces described for the sake of explanation.

The contact hole upper surface 14c is a section surrounded by a roughly annular contact hole upper periphery 14a. A film thickness of the interlayer insulation film 13 increases upwards from the contact hole bottom surface 14e along the contact hole slanted surface 14d, and the contact hole upper periphery 14a is the section where the film thickness reaches a maximum. Since it is preferable that the space occupied by the contact hole upper surface 14c within the upper surface of the interlayer insulation film 13 be as small as possible, it is preferable that the inclination angle of the contact hole slanted surface 14d be large. However, an inclination angle that is too large (near 90 degrees) causes the problem of disconnection, due to a step, in the electrical conduction that should exist between the TFT layer 11 and the first electrode 15. Conversely, if the inclination angle of the contact hole slanted surface 14d becomes smaller and smaller, this causes a problem in that a region in which a predetermined film thickness cannot be achieved grows larger. Note that the predetermined film thickness is determined in advance based on parasitic capacitance produced between the first electrode 15 and the TFT source electrode, drain electrode, gate electrode, signal wiring, power line, etc. In view of the above, such dimensions satisfying the relation $L<3t$ are preferable, where t denotes the thickness of the interlayer insulation film 13 measured at a point along the contact hole upper periphery 14a as shown in FIG. 3A, and L denotes the horizontal distance between a contact hole lower periphery 14b and the contact hole upper periphery 14a also as shown in FIG. 3A. However, the film thickness t and distance L are not limited to such.

Note that, as shown in FIG. 3B, there may be a case where the thickness of the interlayer insulation film 13 increases upwards from the contact hole bottom surface 14e along the contact hole slanted surface 14d, and after the thickness reaches its maximum, the thickness begins to decrease. Even in this case, the contact hole upper periphery 14a is still the portion where the film thickness of the interlayer insulation film 13 reaches its maximum, similarly to the case shown in FIG. 3A.

Also, the "inner region near the contact hole upper periphery 14a" referred to below designates a portion labeled as 14f in FIG. 3A.

Furthermore, a diagonally shaded region shown in FIG. 4, i.e. the contact hole 14 and a region above the contact hole 14, is referred to as a contact hole region 14g.

This concludes a supplementary description of the contact hole 14. The description now returns to FIG. 2.

<Structure of Organic EL Cells>

A plurality of first electrodes 15, each of which is an anode, are layered on the interlayer insulation film 13. Each first electrode 15 is electrically connected to one of the power supply electrode 12 in the TFT layer 11 via the contact hole 14.

The first electrodes 15 are formed with Ag (silver). Alternatively, the first electrodes 15 may be formed with, for example, APC (alloy of silver, palladium, and copper), ARA (alloy of silver, rubidium, and gold), MoCr (alloy of molybdenum and chromium), NiCr (alloy of nickel and chromium), Al (aluminum), an Al alloy, etc. In the case of a top emission type light-emitting element, it is preferable that the first electrodes 15 be formed with a light-reflective material.

The bank 16 (bank part 16a, bank part 16b, . . . ) is formed above the interlayer insulation film 13 and the power supply electrodes 12. The bank 16 is made from an organic material such as resin and thus has insulating properties. Examples of the organic material include acrylic resin, polyimide resin, and novolac-type phenolic resin. Preferably, the bank 16 is resistant to organic solvents. Furthermore, since the bank 16 may be etched, baked, etc. when formed, it is preferable that the bank 16 be formed from highly resistant material that will not change excessively in shape or quality during the etching and baking processes.

In each region defined by the bank 16, an organic light-emitting layer (hereinafter, simply "light-emitting layer") 17a is layered.

It is preferable that the light-emitting layer 17a be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

Note that each light-emitting layer 17a enters into the recess formed by the contact hole 14, becoming concave in conformity with the recess. Suppose that the light-emitting layer 17a is formed simply in a conventional way. In that case, the light-emitting layer 17a is thinner at a portion located along the contact hole slanted surface 14d, especially along the inner region 14f (see FIGS. 3A and 3B) near the contact hole upper periphery 14a than at other portions. Such a thin portion of the light-emitting layer 17 is likely to cause concentration of the electric field. According to the present embodiment, however, a light-emitting layer 17b is additionally formed on the light-emitting layer 17a as shown in FIG. 2 so that the overall film thickness is increased by the thickness of the light-emitting layer 17b. In FIG. 2, the light-emitting layer 17a and the light-emitting layer 17b are distinguished. In practice, however, the light-emitting layer 17a and the light-emitting layer 17b are integral (hereinafter, the light-emitting layer 17a and the light-emitting layer 17b are collectively referred to as the light-emitting layer 17). The light-emitting layers 17a and 17b may be layered as the light-emitting layer 17 through the same processing. Alternatively, the light-emitting layers 17a and 17b may be separately formed by, for example, layering and drying the light-emitting layer 17a first and then layering the light-emitting layer 17b.

The thickness of light-emitting layer 17 is appropriate as long as the thickness at a portion located within the contact hole region 14g is greater than the thickness of the light-emitting layer 17a at a portion located outside the contact hole region 14g. Normally, a preferable thickness of the light-emitting layer 17b, which is part of the light-emitting layer 17, falls within the range of 5 to 100 nm or so.

A second electrode 18, which is a cathode, is layered on the light-emitting layers 17.

The second electrode 18 is formed, for example, of ITO, indium zinc oxide (IZO), etc. In the case of a top-emission type organic EL cells, it is preferable that the second electrode 18 be formed with a transparent material.

Note that, while not shown in the figures, a widely-known encapsulation layer is provided above the second electrode 18. The encapsulation layer is formed, for example, with silicon nitride (SiN), silicon oxynitride (SiON), etc., and protects the light-emitting layers 17 from deterioration due to exposure to water, air, etc. In the case of top-emission type organic EL cells, it is preferable that the encapsulation layer also be formed with a transparent material.

<Advantageous Effects of the Structure in Embodiment>

The supplemental explanation of the advantageous effects of the structures according to the present embodiment will be given below with reference to FIGS. 5A to 5C.

FIG. 5A is a schematic top view showing the apertures 30 according to the present embodiment, along with the surrounding area. FIG. 5B is a schematic top view showing conventional apertures along with the surrounding area.

In FIG. 5A, the diagonally shaded area of each aperture 30 corresponds to where the light-emitting layer 17 has an ordinal thickness and therefore without reduction of luminance brightness. In contrast, the area within each contact hole upper periphery 14a is not diagonally shaded. The non-shaded area corresponds to the contact hole region 14g where the light-emitting layer 17 is thicker than the portion of the light-emitting layer 17 located outside the contact hole region 14g. Therefore, the electric field in the region is smaller and thus the luminance brightness is lower. However, the surface area corresponding to the contact hole region 14g in each aperture 30 is minute as compared to the surface area corresponding to the region other than the contact hole region 14g. Therefore, even if luminescence brightness decreases in these limited regions, irregular light emission is not conspicuous.

Furthermore, as compared to the conventional apertures shown in FIG. 5B, each aperture 30 in FIG. 5A has a large surface area in which luminescence brightness does not decrease. This surface area corresponds to the lattice 16c in FIG. 5B (since the contact hole is conventionally buried under the bank, the lattice 16c is the portion corresponding to the area that is occupied by the bank, minus the contact hole). Accordingly, the aperture ratio in the organic EL display panel 1 can be improved over a conventional display panel.

FIG. 5C is a schematic top view showing an aperture 30 and the surrounding area when a contact hole is simply provided within the aperture without adopting the structure in Embodiment 1.

Each diagonally shaded area shown in FIG. 5C corresponds to the inner region 14f near the contact hole upper periphery 14a shown in FIGS. 3A and 3B. As described above, the light-emitting layer 17a is thinner in the area than the ordinal thickness, and therefore due to concentration of the electric field, the luminescence brightness increases more than usual. An increase in luminescence brightness is visible even in a minute area, and therefore irregular light emission in this section ends up being conspicuous.

<Manufacturing Method>

FIGS. 6A to 6E and 7A to 7C are views illustrating processing steps of a method of manufacturing the organic EL display panel according to an embodiment of the present invention.

The method includes the first to seventh steps.

Figure 6A:
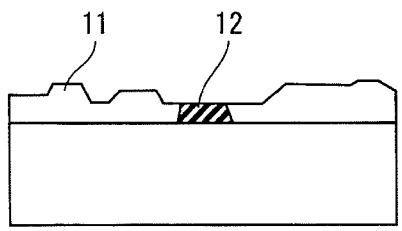
FIGS. 6A to 6E are views illustrating processing steps of a method of manufacturing the organic EL display panel according to the embodiment of the present invention.

First, in the first step shown in FIG. 6A, the TFT layer 11 is formed on the substrate 10.

Figure 6B:
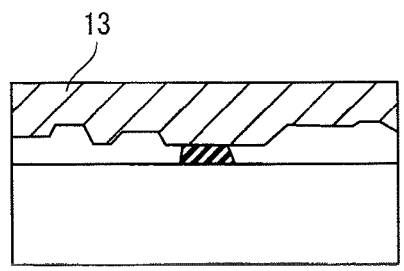

Next, in the second step shown in FIG. 6B, the interlayer insulation film 13 formed on the TFT layer 11.

Figure 6C:
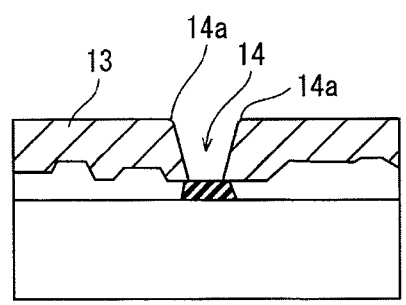

Next, in the third step shown in FIG. 6C, a contact hole 14 corresponding to a pixel is formed by etching the interlayer insulation film 13.

Figure 6D:
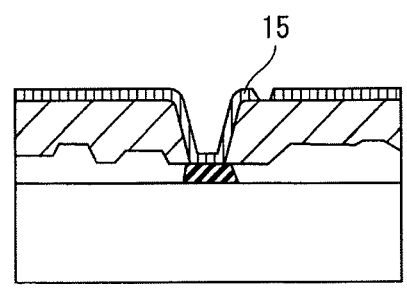

Next, in the fourth step shown in FIG. 6D, a thin Ag film is formed on the interlayer insulation film 13 by, for example, sputtering, and then the first electrodes 15 are formed as a matrix in units of pixels by, for example, patterning the thin Ag film using photolithography. Note that the thin Ag film may be formed by vacuum deposition or the like.

Figure 6E:
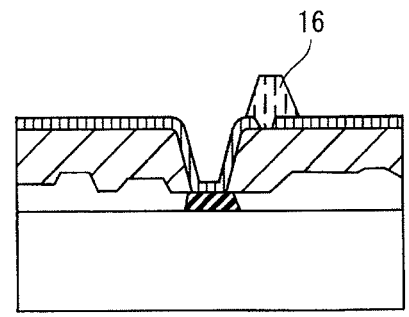

Next, in the fifth step shown in FIG. 6E, a bank material layer is formed on the first electrode 15 and the interlayer insulation film 13, and part of the bank material layer is removed to form the bank 16 defining the apertures 30 (FIG. 6E). The bank material layer may be formed, for example, by performing coating or the like. The bank material layer is removed by forming a resist pattern on the bank material layer, followed by etching.

Figure 7A:
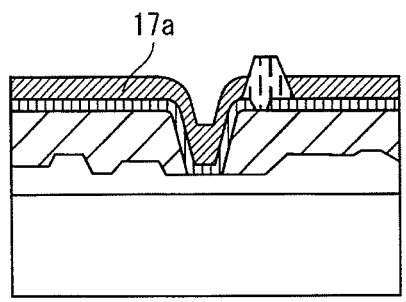
FIGS. 7A to 7C are views illustrating processing steps of the method of manufacturing the organic EL display panel according to the embodiment of the present invention (continued from FIG. 6).
Figure 7B:
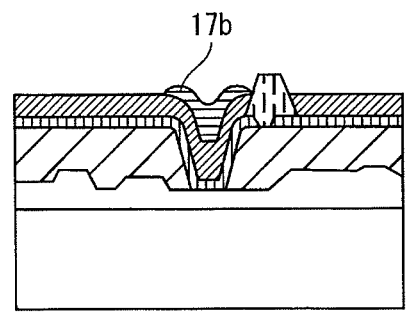

Next, in the sixth step, an ink composition (hereinafter, simply "ink") containing organic EL material is dripped into the region defined by the bank 16 in an organic EL cell 20 by, for example, the ink jet method thereby to form a light-emitting layer 17a as shown in FIG. 7A. After the ink dripped for forming the light-emitting layer 17a is dried, ink for forming the light-emitting layer 17b is dripped as shown in FIG. 7B. To form the light-emitting layer 17, ink may be dripped by the dispenser method, nozzle coating method, spin coat method, intaglio printing, letterpress printing, etc.

The steps shown in FIGS. 7A and 7B may be performed in a single step, by dripping an extra amount of ink for forming the light-emitting layer 17b shown in FIG. 7B, at the same time when ink for forming the light-emitting layer 17a shown in FIG. 7A is dripped.

Figure 7C:
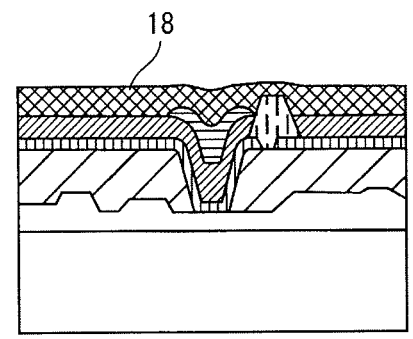

Next, in the seventh step, a thin ITO film that will be the second electrode 18 is formed by, for example, sputtering (FIG. 7C).

<Modifications and Supplemental>

The organic EL display panel according to the present invention is not limited to the specific examples shown in the figures mentions above. It should be naturally appreciated that various modifications may be made without departing from the gist of the present invention.

(1) Addition of Intermediate Layer (IL Layer) and Electron Injection Layer

In addition to the structure described in the above Embodiments, each organic EL cell may be provided with an IL layer 41 between the first electrode 15 and the light-emitting layer 17, and with an electron injection layer 42 between the light-emitting layer 17 and the second electrode 18.

Figure 8:
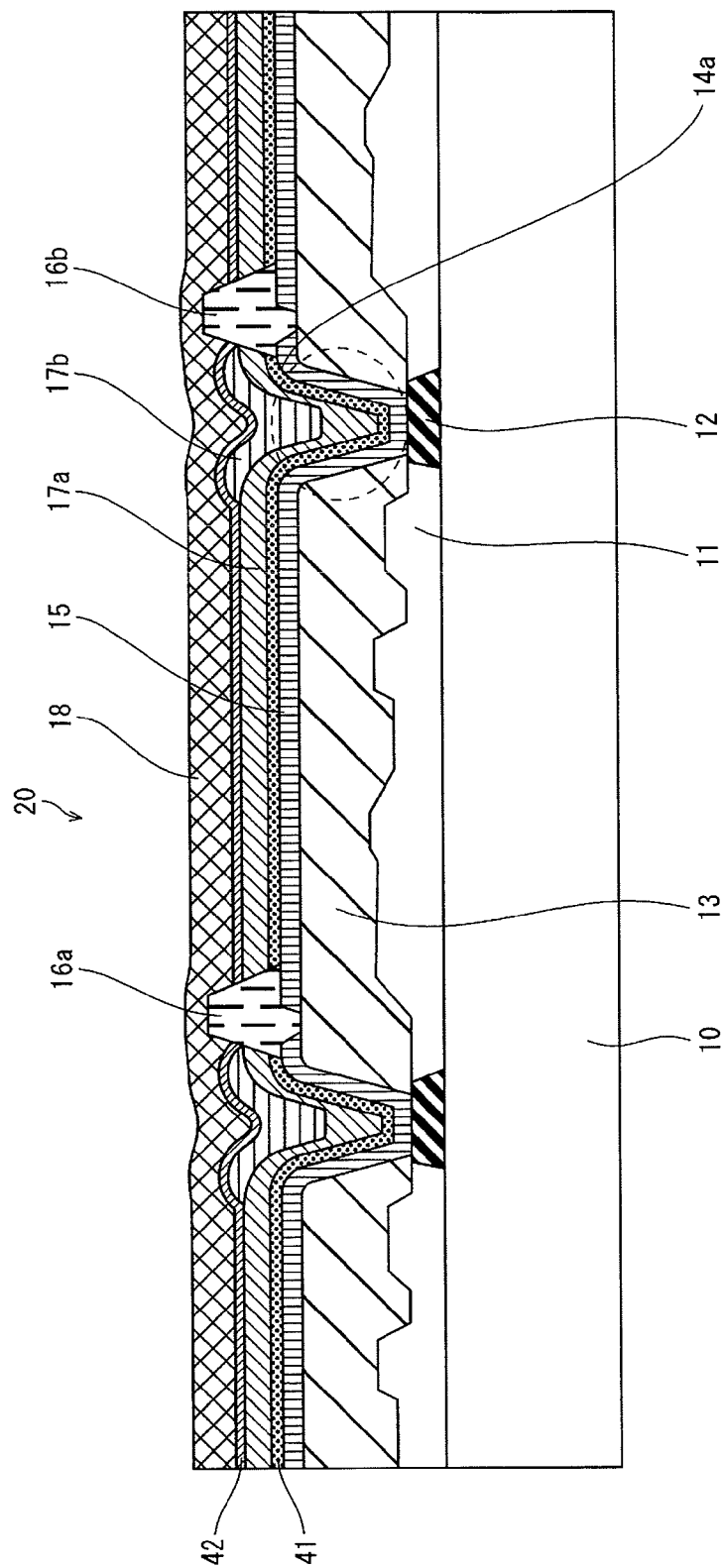
FIG. 8 is a schematic sectional view showing part of an organic EL display panel having an IL layer and an electron injection layer according to a modification of the present invention.

FIG. 8 shows the organic EL cell 20b according to Embodiment 1 and shown in FIG. 2, when provided with the IL layer 41 and the electron injection layer 42.

The IL layer 41 is formed with an indium tin oxide (ITO) layer and a hole injection layer that is layered on the ITO layer.

The ITO layer is disposed between the hole injection layer and each first electrode 15 and has the function of improving the bonding between the hole injection layer and the first electrodes 15.

The hole injection layer is formed with WOx (tungsten oxide) or MoxWyOz (molybdenum tungsten oxide). By providing a hole injection layer, holes can be easily injected, contributing to effective light emission by electrons in the light-emitting layer 17, which allows for excellent light-emitting characteristics to be obtained. The hole injection layer should be formed with a metal compound that fulfills the function of hole injection. Examples of such a metal compound include a metal oxide, metal nitride, and metal oxynitride.

The electron injection layer 42 has a function of transporting electrons injected through the second electrode 18 to the light-emitting layer 17 and is formed, for example, of barium, phthalocyanine, lithium fluoride, or a combination thereof.

In the manufacturing method, the IL layer 41 is formed between the fourth step and the fifth step.

The IL layer 41 is formed by forming a thin ITO film by, for example, sputtering, and then forming the ITO layer through patterning the thin ITO film by photolithography, for example. Subsequently, using a composition containing WOx or MoxWyOz, a thin film of WOx or MoxWyOz is formed by technology such as vacuum deposition, sputtering, etc.

The electron injection layer 42 is formed between the sixth step and the seventh step.

The electron injection layer is formed after the sixth step by forming a thin barium film that will be the electron injection layer 7 by, for example, vacuum deposition.

(2) Using Line Bank

Figure 9:
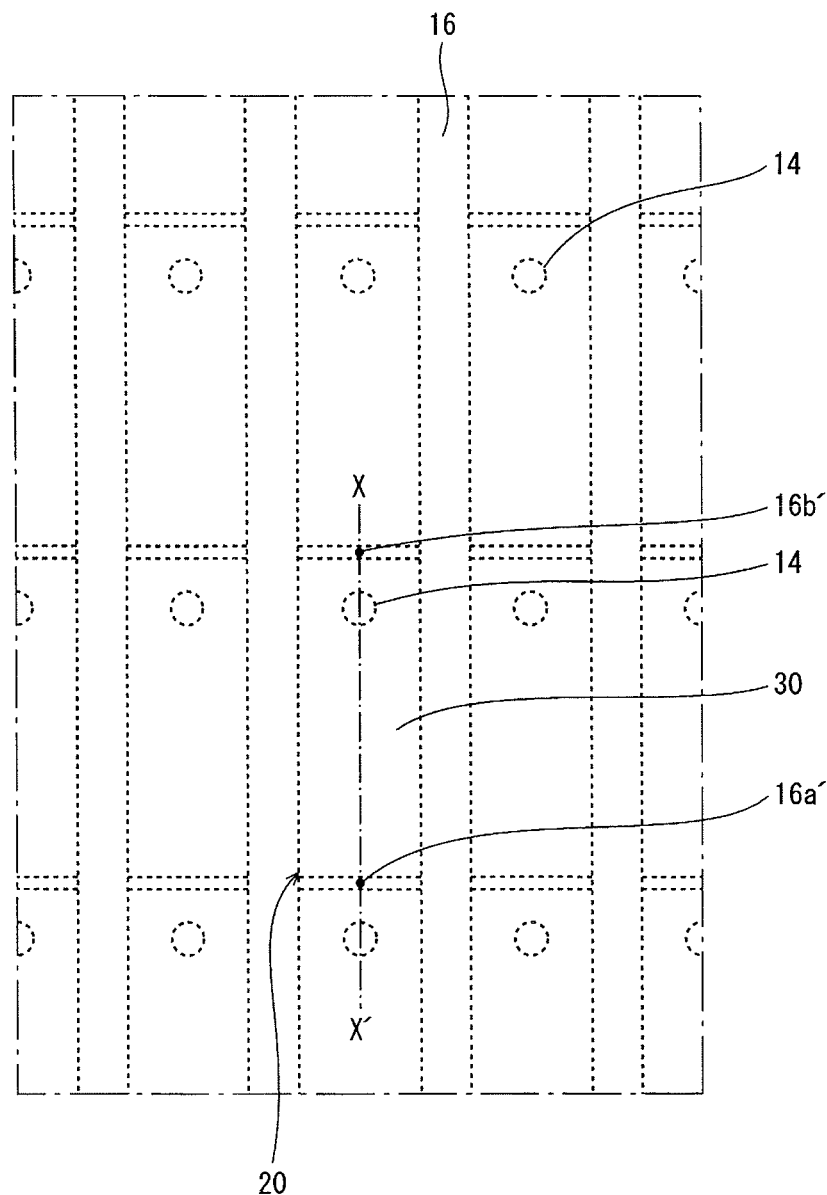
FIG. 9 is a schematic plan view showing part of an organic EL display panel having a line-bank configuration according to a modification of the present invention.

In Embodiments and the Modifications above, the bank 16 has been described as a pixel bank, but the line bank shown in FIG. 9 may be adopted in the present invention.

Unlike the above-described pixel bank, a line bank does not completely surround a light-emitting laminate, but rather defines two opposing sides of the light-emitting laminate. In the case of a line bank, the bank 16 is formed to partition a plurality of pixels by column or by row. In other words, the bank 16 exists only as columns or as rows on either side of a light-emitting layer 17, and a light-emitting layer 17 is continuous with other light-emitting layers 17 in the same column or row.

Figure 10:
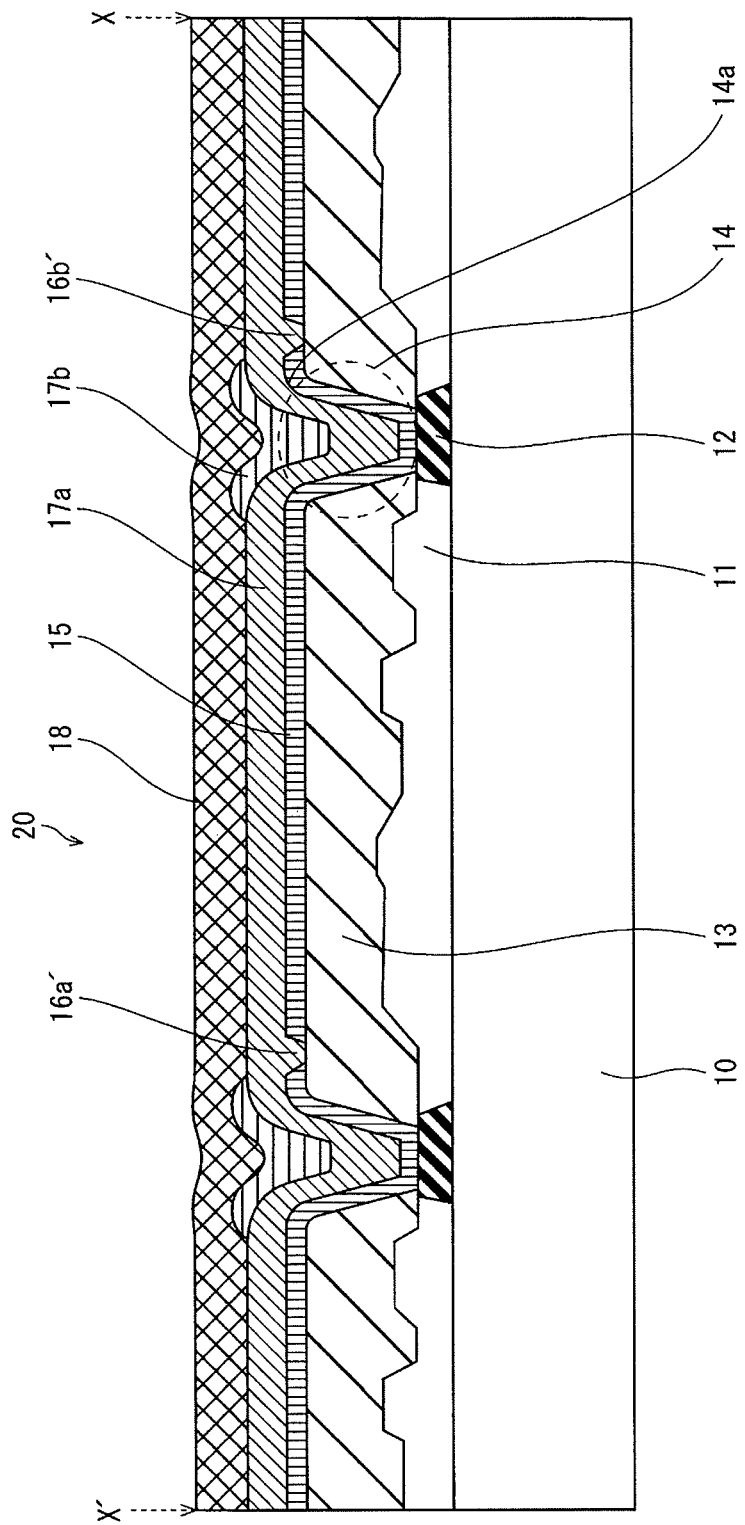
FIG. 10 is a schematic sectional view of the organic EL display panel having a line-bank configuration according to the modification of the present invention, taken to show part around an organic EL cell.

FIG. 10 is a schematic sectional view of showing an organic EL cell 20 when a line-bank configuration is adopted.

In FIG. 10, no bank part (16a' and 16b') exists where the bank parts 16a and 16b exist in the organic EL cell 20 with a pixel bank in FIG. 2.

(3) In the above Embodiments, top-emission type cells are described, but the present invention is not limited in this way; the cells may be bottom-emission type.

(4) In the above Embodiments, a bank is used. However, when a bank is used, an electric field may concentrate at the edge of a first electrode 15, or a first electrode 15 and second electrode 18 may short out. To avoid these problems, instead of using a bank, each first electrode 15 may be covered with an insulating film in sections corresponding to the bank.

Figure 11:
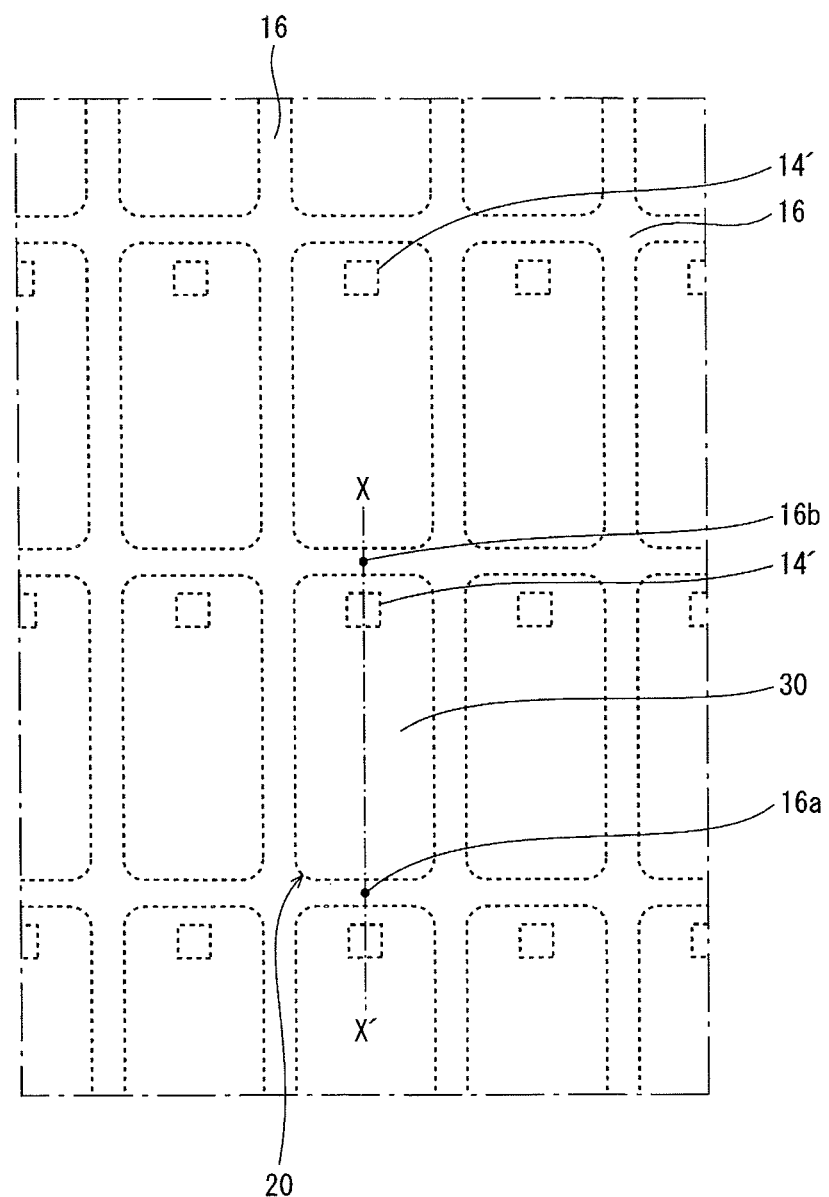
FIG. 11 is a schematic plan view of an organic EL display panel having contact holes (rectangular holes) according to a modification of the present invention.

(5) In the above Embodiments, the contact holes are described as being circular in shape, but the present invention is not limited in this way as long as the contact holes are through holes. For example, the contact holes may be rectangles, like the contact holes 14' in FIG. 11.

(6) An organic EL display panel 1 according to an aspect of the present invention, or an organic EL display panel according to one of the Modifications, may be mounted in a display device 100.

Figure 12:
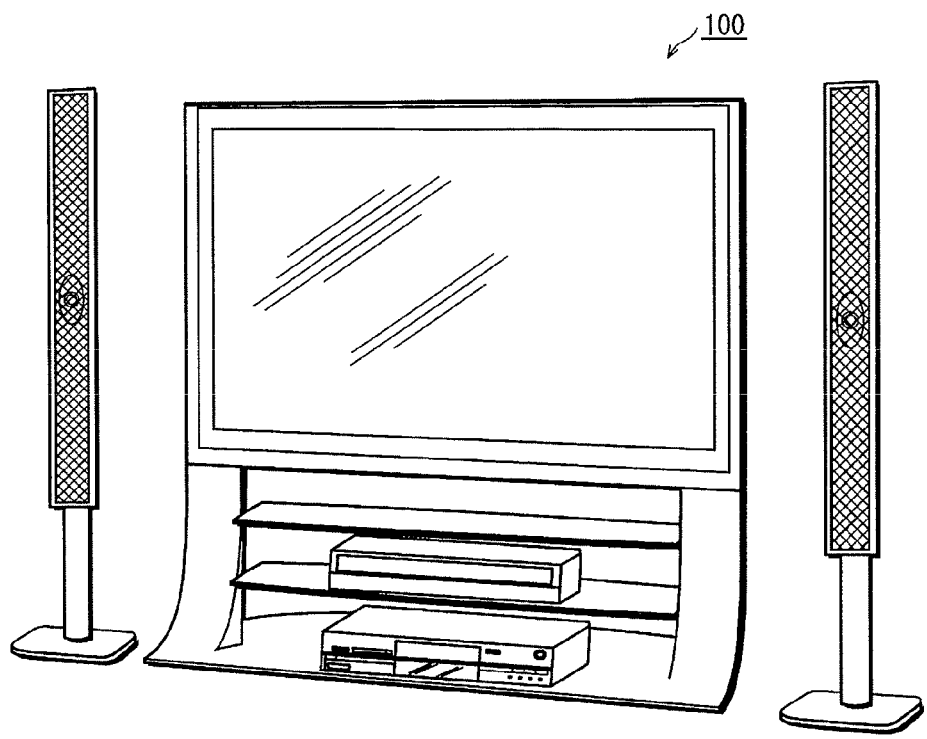
FIG. 12 is an oblique view showing an external representation of a display device according to a modification of the present invention.

FIG. 12 is an oblique view showing an external representation of the display device 100.

An organic EL display device with the same advantageous effects as described above can thus be constructed.

(7) The above Embodiments and Modifications may be combined with one another.

INDUSTRIAL APPLICABILITY

The organic EL display panel according to the present invention has high light-extraction efficiency and is appropriate as a display element such as a cellular telephone display, a television, etc., or in a variety of light sources.

REFERENCE SIGNS LIST 1 organic EL display panel
10 substrate
11 TFT layer
12 power supply electrode
13 interlayer insulation film
14 contact hole
15 first electrode
16 bank
17 light-emitting layer
18 second electrode
20 organic EL cell
30 aperture
41 IL layer
42 electron injection layer

The invention claimed is:

1. An organic EL display panel, comprising:
    a TFT layer;
    an interlayer insulation film on the TFT layer and having a plurality of contact holes, each of the plurality of contact holes corresponding to one of a plurality of pixels;
    a plurality of first electrodes on the interlayer insulation film, each of the plurality of first electrodes corresponding to one of the plurality of pixels and being conductive with the TFT layer via one of the plurality of contact holes;
    a bank defining a plurality of apertures, at least one of the plurality of apertures corresponding to each of a plurality of colors, and at least one of the plurality of contact holes being located beneath each of the plurality of apertures;
    a plurality of organic light-emitting layers each in one of the plurality of apertures; and
    a second electrode above the plurality of organic light-emitting layers, wherein
    each of the at least one of the plurality of contact holes has an upper periphery and a lower periphery, a cross-sectional area of each of the at least one of the plurality of contact holes increasing from the lower periphery to the upper periphery,
    each of the at least one of the plurality of contact holes and a region thereabove constitutes a contact hole region,
    each of the plurality of light-emitting layers is composed of a first layer and a second layer of a same material, the first layer being concaved in conformity with a recess defined by the contact hole, the second layer being layered on the first layer and within the contact hole region, the second layer being concaved in conformity with the first layer, and
    in each of the plurality of apertures, a thickness of the organic light-emitting layer is greater throughout a portion within the upper periphery of the contact hole region than at a portion outside the contact hole region.

2. The organic EL display panel of claim 1, wherein in the contact hole region, the second layer is layered on the first layer after the first layer has been dried.

3. The organic EL display panel of claim 1, wherein the bank defines the plurality of apertures in lines, each of the plurality of apertures corresponding to one of the plurality of colors.

4. The organic EL display panel of claim 1, wherein the bank defines the plurality of apertures each of which corresponds to one of the plurality of pixels, to one of the plurality of colors, and to one of the plurality of first electrodes.

5. The organic EL display panel of claim 1, wherein the first layer and the second layer of an individual one of the plurality of light-emitting layers are of a same color that is one of red, green, and blue.

6. The organic EL display panel of claim 1, wherein the interlayer insulation film is a planarizing film.

7. An organic EL display device comprising the organic EL display panel of claim 1.

8. The organic EL display panel of claim 1, wherein the thickness of the organic light-emitting layer is greater throughout a portion adjacent to the upper periphery of the contact hole region than at the portion outside the contact hole region, the portion outside the contact hole region being outside the portion adjacent to the upper periphery of the contact hole region.

9. A manufacturing method of an organic EL display panel, the manufacturing method comprising:
    forming a TFT layer;
    forming an interlayer insulation film on the TFT layer;
    forming a plurality of contact holes in the interlayer insulation film, each of the plurality of contact holes corresponding to one of a plurality of pixels;
    forming a plurality of first electrodes on the interlayer insulation film, each of the plurality of first electrodes corresponding to one of the plurality of pixels and being conductive with the TFT layer via one of the plurality of contact holes;

forming a bank that defines a plurality of apertures, at least one of the plurality of contact holes located beneath each of the plurality of apertures;

forming a plurality of organic light-emitting layers each in one of the plurality of apertures; and forming a second electrode above the plurality of organic light-emitting layers, wherein each of the at least one of the plurality of contact holes is formed to have an upper periphery and a lower periphery, a cross-sectional area of each of the at least one of the plurality of contact holes increasing from the lower periphery to the upper periphery, each of the at least one of the plurality of contact holes and a region thereabove constitutes a contact hole region, and each of the plurality of light-emitting layers is composed of a first layer and a second layer of a same material, the first layer being concaved in conformity with a recess defined by the contact hole, the second layer being layered on the first layer and within the contact hole region, the second layer being concaved in conformity with the first layer, and a thickness of the organic light-emitting layer in each of the plurality of apertures is greater throughout a portion within the upper periphery of the contact hole region than at a portion outside the contact hole region.

10. The manufacturing method of claim 9, wherein in the contact hole region, the second layer is layered on the first layer after the first layer has been dried.

11. The manufacturing method of claim 10, wherein an ink-jet method is used to form the plurality of organic light-emitting layers, and in each of the plurality of apertures, the plurality of organic light-emitting layers are formed within the contact hole region by dripping ink containing a same organic material of a same color.

12. The manufacturing method of claim 10, wherein an ink-jet method is used to form the plurality of organic light-emitting layers, and ink containing an organic light-emitting material of one of a plurality of colors is dripped into the contact hole region in each of the plurality of apertures to form the first layer, the ink dripped into the contact hole region in each of the plurality of apertures is dried so that the first layer is formed, and after the ink dripped to form the first layer is dried, ink containing an organic light-emitting material of a same color as the first layer is dripped into the contact hole region in the aperture to form the second layer.

13. The manufacturing method of claim 9, wherein an ink-jet method is used to form the plurality of organic light-emitting layers.

14. The manufacturing method of claim 9, wherein the bank is formed to define the plurality of apertures in lines that each correspond to one of the plurality of colors.

15. The manufacturing method of claim 9, wherein the bank is formed to define the plurality of apertures each of which corresponds to one of the plurality of pixels, to one of the plurality of colors, and to one of the plurality of first electrodes.

16. The manufacturing method of claim 9, wherein the first layer and the second layer of an individual one of the plurality of light-emitting layers are formed of a same color that is one of red, green, and blue.

* * * * *